(12) United States Patent
Huang et al.

(10) Patent No.: US 7,312,105 B2
(45) Date of Patent: Dec. 25, 2007

(54) LEADFRAME OF A LEADLESS FLIP-CHIP PACKAGE AND METHOD FOR MANUFACTURING THE SAME

(75) Inventors: Yao-Ting Huang, Kaohsiung (TW); Chih-Huang Chang, Yongkang (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 366 days.

(21) Appl. No.: 11/147,918

(22) Filed: Jun. 8, 2005

(65) Prior Publication Data

US 2005/0287711 A1 Dec. 29, 2005

(30) Foreign Application Priority Data

Jun. 29, 2004 (TW) .............................. 93119072 A

(51) Int. Cl.
*H01L 21/44* (2006.01)
*H01L 21/48* (2006.01)

(52) U.S. Cl. ...................................... 438/108; 438/123
(58) Field of Classification Search ................ 438/108, 438/106, 123, 612; 257/676
See application file for complete search history.

(56) References Cited

U.S. PATENT DOCUMENTS 5,454,905 A * 10/1995 Fogelson ..................... 29/827
5,466,966 A * 11/1995 Ito .............................. 257/666
5,656,550 A * 8/1997 Tsuji et al. ................. 438/123

FOREIGN PATENT DOCUMENTS

| TW | 457662 | 10/2001 |
|----|--------|---------|
| TW | 463342 | 11/2001 |
| TW | 567598 | 11/2001 |

* cited by examiner

*Primary Examiner*—Theresa Doan
(74) *Attorney, Agent, or Firm*—Thomas, Kayden, Horstemeyer & Risley

(57) ABSTRACT

A leadframe of a leadless flip-chip package includes a plurality of inner leads, a non-conductive ink layer and a solder mask layer. The inner leads have a plurality of bump-connecting terminals, a plurality of outer terminals and a plurality of redistribution lead portions. A half-etched recession is formed on lower surfaces of the redistribution lead portions, and is filled with the non-conductive ink layer. The non-conductive ink layer fixes the redistribution lead portions onto the bump-connecting terminals. The solder mask layer is easily formed on the non-conductive ink layer and covers the inner leads.

8 Claims, 8 Drawing Sheets

LEADFRAME OF A LEADLESS FLIP-CHIP PACKAGE AND METHOD FOR MANUFACTURING THE SAME

This application claims the benefit of Taiwan application Serial No. 93119072, filed Jun. 29, 2004, the subject matter of which is incorporated herein by reference.

BACKGROUND OF THE INVENTION

1. Field of the Invention

The invention relates in general to leadless flip-chip packaging technology, and more particularly to a leadframe of leadless flip-chip package and a method for manufacturing the same.

2. Description of the Related Art

The conventional leadless flip-chip package uses a leadless leadframe to replace a flip-chip package substrate. A chip is flip-chip bonded onto the inner leads of the leadless leadframe to reduce packaging cost. The leadless leadframe for flip-chip bonding has to define a bump bonding region on the upper surface of the inner leads, otherwise the bump disposed on the chip will be spread to be outside the bump bonding region. According to the technology disclosed in Taiwanese Patent Publication No. 567598 "Semi-Conductor Chip Flip-Chip Package", a plurality of recessions are formed on the upper surface of the inner leads to define the bump bonding region. According to the technology disclosed in Taiwanese Patent Publication No. 463342 "Quad Flat Package", a solder mask layer is printed on the upper surface of the inner leads. The solder mask layer has a plurality of openings for defining a bump bonding region to facilitate the connection of the bumps on chip and control the bump collapse. The inner leads are different from the redistribution circuit of the conventional flip-chip package substrate, and can not be fixed onto the dielectric layer of the package substrate. Therefore, the length and the diameter of the inner leads fail to meet the requirement as to achieve the function of electrical redistributed connection and high density wiring. The dielectric layer can be a glass fabric with pre-impregnated resin for instance. Moreover, there are clearances existing between the inner leads, therefore impeding the formation of a quality printing carrying surface and the printing of the solder mask layer. The lower surface of the inner leads and the printing compound are easily contaminated by the solder mask layer. When the inner leads of the leadless leadframe are unable to achieve a redistribution design, the position of the chip bump needs to be reallocated. Conventionally, a redistribution circuit layer is made on the active surface of the chip. A leadless leadframe is unable to achieve a redistribution design in response to the situation when the position of the chip bump varies from one chip to another (for example, the position of the bump may be arranged in grid arrays, a peripheral arrangement or a central arrangement) or when the outer terminal of the inner leads of leadless leadframe are of various specifications. The leadless leadframe are thus limited to a simple design of the inner leads of the leadframe, and can only seal the chips whose bumps are disposed on fixed positions. Therefore, the leadless leadframe can only replace a few number of flip-chip package substrates with simple circuit design, and are unable to widely replace the flip-chip package substrate in a lower cost.

A method for packaging a flip-chip bonded chip scale package is disclosed in Taiwanese Patent Publication No. 457662, "The Manufacturing Method and Structure of Chip Scale Package". A leadless leadframe is formed during the packaging process . . . . The manufacturing process of forming the leadless leadframe can not precede the manufacturing process of packaging. But rather, the manufacturing process of packaging includes the step of manufacturing the leadless leadframe. A plurality of inner leads are formed by partly etching the top layer of a leadframe, which is a metal plate for instance, and the inner leads are carried by the under layer of the leadframe, so that the inner leads have a first end and a second end according to redistribution design. A semi-conductor chip is flip-chip bonded onto the inner leads, the chip bumps are connected to the first end of the inner leads. After an underfilling material is formed, the under layer of the leadframe is removed through etching. In the step of etching the under layer of the leadless leadframe, the chips are also etched at the same time, causing difficulties in operation and increasing failure rate in manufacturing process. Besides, in the step of etching to remove the under layer of the leadframe, in the absence of appropriate etching-stop point, the inner leads may be short-circuited if the inner leads are over-etched. After the step of etching and removing the under layer of the leadframe, the inner leads of the leadframe has an exposed lower surface. The exposed circuit needs extra protections; otherwise a short circuit would occur to naked circuits, making the manufacturing process difficult to control.

SUMMARY OF THE INVENTION

The main object of the invention is to provide a leadframe of a leadless flip-chip package including a plurality of inner leads, a non-conductive ink layer and a solder mask layer. The inner leads have a plurality of bump-connecting terminals, a plurality of outer terminals and a plurality of redistributed lead portions. The non-conductive ink layer fills the recessions of the lower surfaces of the redistributed lead portions for fixing the redistributed lead portions and the bump-connecting terminals, so that the solder mask layer can be easily formed.

The leadframe of the leadless flip-chip package according to the invention mainly includes a plurality of inner leads, a non-conductive ink layer and a solder mask layer. The inner leads have a plurality of bump-connecting terminals, a plurality of outer terminals and a plurality of redistributed lead portions. The redistributed lead portions correspondingly connects bump-connecting terminal to outer terminals. The lower surface of the redistributed lead portions has a half-etched recession formed thereon. The non-conductive ink layer fills the recessions for fixing the redistributed lead portions and the bump-connecting terminals and does not cover the lower surface of the outer terminals, so that the solder mask layer is formed on the non-conductive ink layer and covers the inner leads. The solder mask layer has a plurality of openings for exposing the upper surface of the bump-connecting terminals.

Other objects, features, and advantages of the invention will become apparent from the following detailed description of the preferred but non-limiting embodiments. The following description is made with reference to the accompanying drawings.

DETAILED DESCRIPTION OF THE INVENTION

FIRST EMBODIMENT

Figure 1:
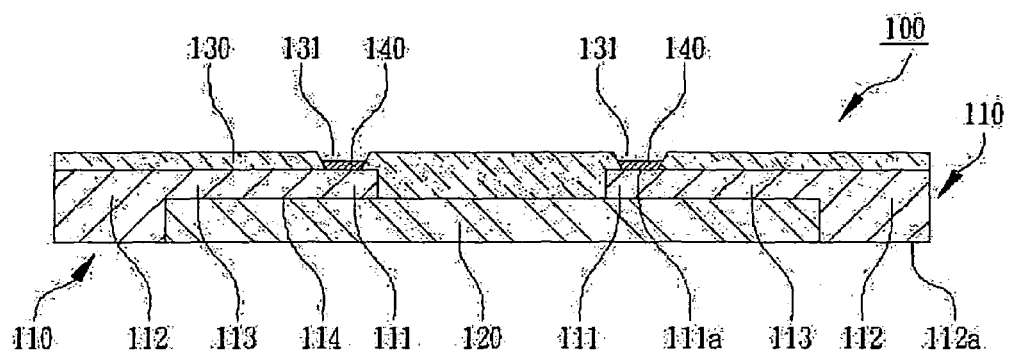
FIG. 1 is a cross-sectional view of a leadframe of a leadless flip-chip package according to a first embodiment of the invention.
Figure 2:
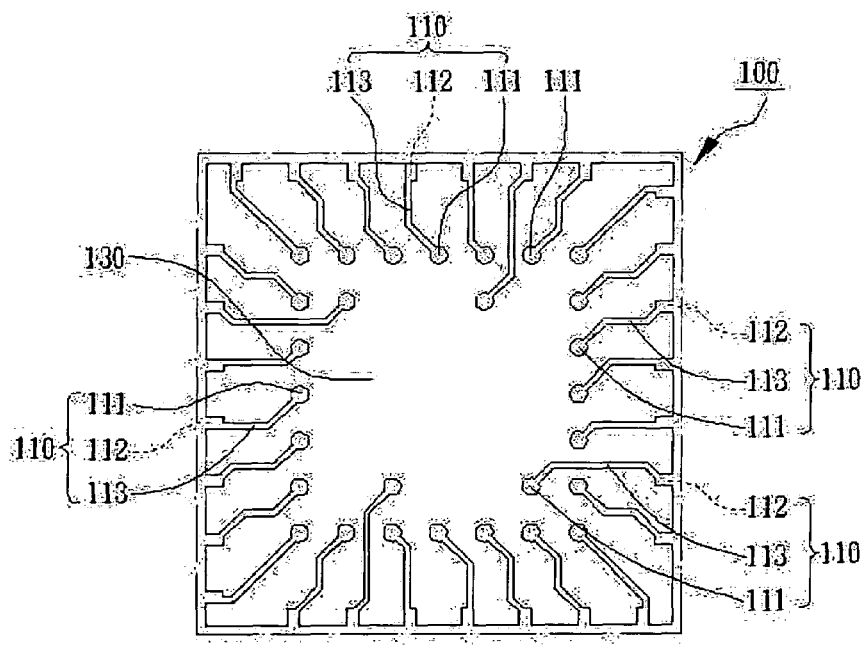
FIG. 2 is a diagram of the upper surface of the leadframe of the leadless flip-chip package according to a first embodiment of the invention.
Figure 3:
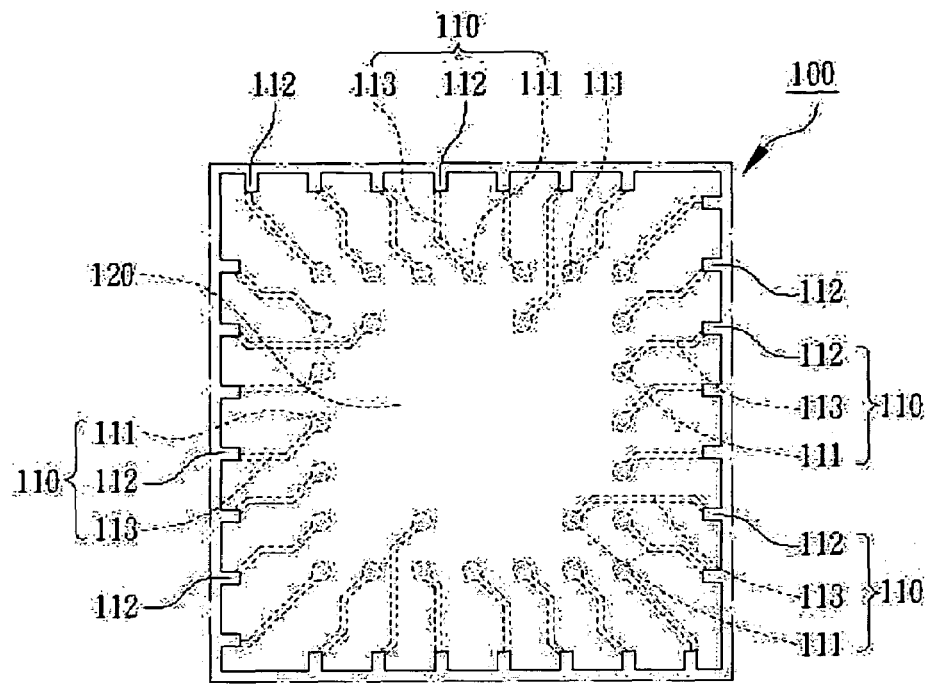
FIG. 3 is a diagram of the lower surface of the leadframe of the leadless flip-chip package according to a first embodiment of the invention.
Figure 5:
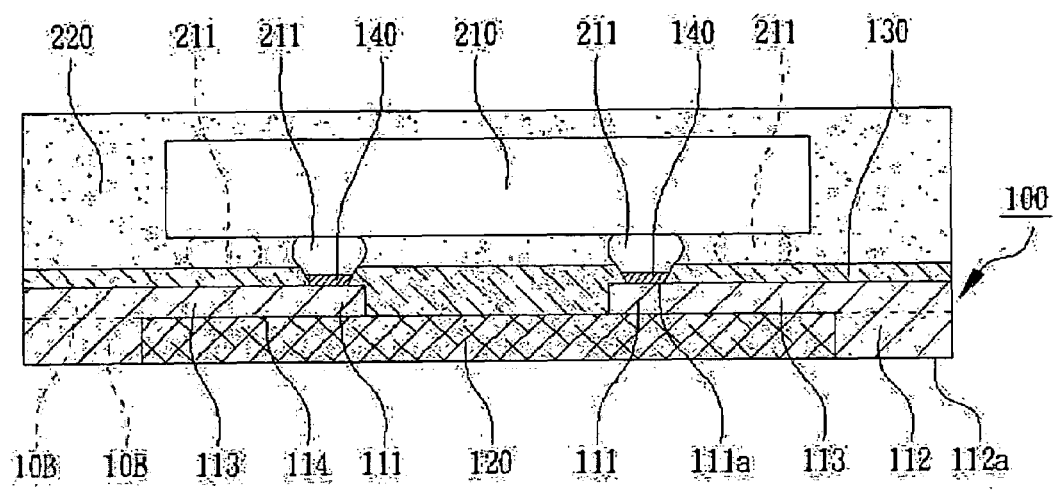
FIG. 5 is a cross-sectional view of a leadless flip-chip package using the leadframe according to the first embodiment of the invention.

Referring to FIGS. 1, 2 and 3, in every package unit, a leadframe of a leadless flip-chip package 100 mainly includes a plurality of inner leads 110, a non-conductive ink layer 120 and a solder mask layer 130. The non-conductive ink layer 120 and the solder mask layer 130 are insulation layers. Referring to FIGS. 1 and 2, the inner leads 110 has a plurality of bump-connecting terminals 111, a plurality of outer terminals 112 and a plurality of redistributed lead portions 113. The redistributed lead portions 113 correspondingly connect bump-connecting terminals 111 to the outer terminals 112, the bump-connecting terminals 111 correspond to a plurality of bump 211 of a flip-chip chip 210, as shown in FIG. 5. The bump-connecting terminals 111 can be arranged in grid arrays or arranged on the periphery of corresponding flip-chip chip. Moreover, the redistributed lead portions 113 connect the outer terminals 112, so that the outer terminals 112 can be formed at appropriate positions. Preferably, the outer terminals 112 are arranged in grid arrays to be bonded onto an external printed circuit board (not shown in the diagram).

Referring to FIG. 1, a recession made from half-etching 114 is formed on the lower surface of the redistributed lead portions 113, so that the thickness of the redistributed lead portions 113 is preferably not larger than half of the thickness of corresponding outer terminals 112a. The non-conductive ink layer 120 fills the recession 114 for fixing the redistributed lead portions 113 and the bump-connecting terminals 111. Preferably, no through clearance exist between the redistributed lead portions 113, so that the solder mask layer 130 can be printed and formed easily. Preferably, the recession 114 is extended to the lower surface of the bump-connecting terminals 111, and the non-conductive ink layer 120 does not cover up a lower surface 112a of the outer terminals 112. That is to say, the lower surface 112a is exposed outside the non-conductive ink layer 120 and is not covered up by the non-conductive ink layer 120. Besides, the solder mask layer 130 is formed on the non-conductive ink layer 120 and covers up the inner leads 110. That is to say, the solder mask layer 130 is formed and filled between the inner leads 110, so that the redistributed lead portion 113 is enveloped by the non-conductive ink layer 120 and the solder mask layer 130. The solder mask layer 130 has a plurality of openings 131 for exposing the upper surface 111a of the bump-connecting terminals 111, and a nickel-gold plating layer 140 is formed on 111 the upper surface 111a of the bump-connecting terminals for bonding the bumps 211 of the flip-chip chip 210 as shown in FIG. 5.

The leadframe of the leadless flip-chip package 100 includes the inner leads 110 having re-distributed connecting points which is fixed by the non-conductive ink layer 120, so that the redistributed lead portions 113 can be designed to have longer or shorter length and narrower width of the lead to fit into the disposition of various flip-chip chip bumps. Moreover, the inner leads 110 are fixed by the non-conductive ink layer 120, so that the solder mask layer 130 can be easily formed on the inner leads 110. Since the non-conductive ink layer 120 fills the recession 114, so that the lower surface 112a of the outer terminals 112 will not be contaminated by the molding compound when forming and packaging the solder mask layer 130. Furthermore, the manufacturing process of the leadframe of the leadless flip-chip package 100 can be separated from the flip-chip package manufacturing process. Therefore, the leadframe of the leadless flip-chip package 100 can serve as a chip carrier for the flip-chip package.

Figure 4A:
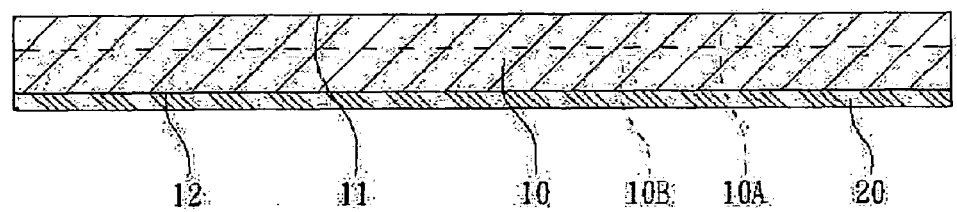
FIGS. 4A to 4K are cross-sectional views of the leadframe of the leadless flip-chip package during manufacturing process according to the first embodiment of the invention.
Figure 4B:
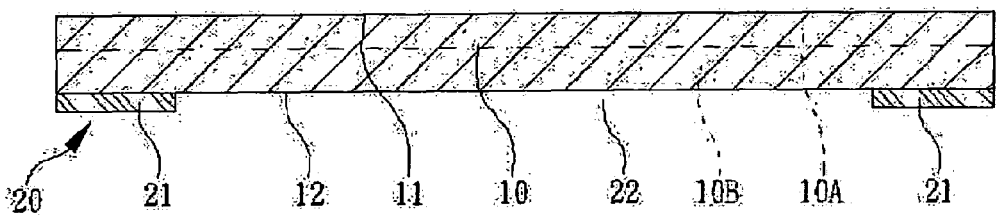

With regard to the manufacturing method of using the above leadframe of the leadless flip-chip package 100 as a chip carrier, referring to FIG. 4A, a metal plate 10 is provided. The metal plate 10 has an upper surface 11 and a lower surface 12. An upper part 10A, a lower part 10B and at least an inner lead region the metal plate 10 are defined on the above the inner leads 110, and a first dry film 20 (first dry film) is adhered onto the lower surface 12 of the metal plate 10. Next, referring to FIG. 4B, the first dry film 20 is exposed and developed, so that a covering portion 21 and a exposing portion 22 are formed on the first dry film 20. The covering portion 21 covers up a region of the lower surface 12 of the metal plate 10 which is used for forming the above outer terminals 112. The remaining part of the lower surface 12 not covered up by the covering portion 21 is exposed as the exposing portion 22 to be patterned and etched.

Figure 4C:
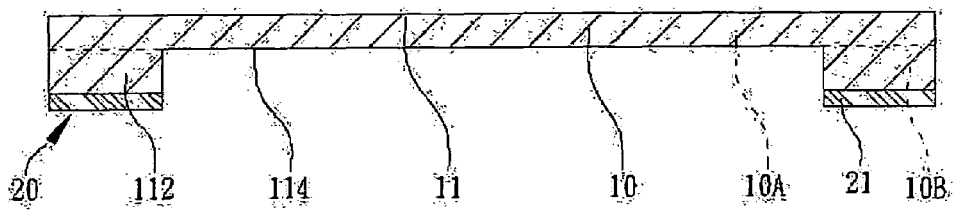
Figure 4D:
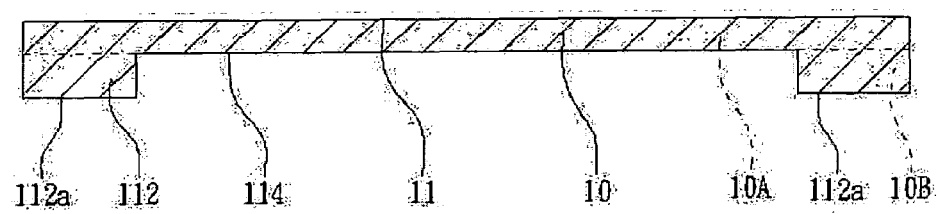
Figure 4E:
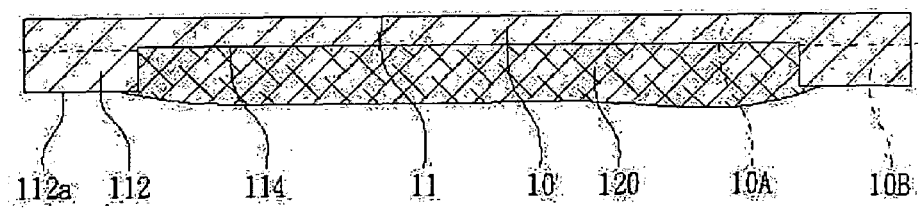
Figure 4F:
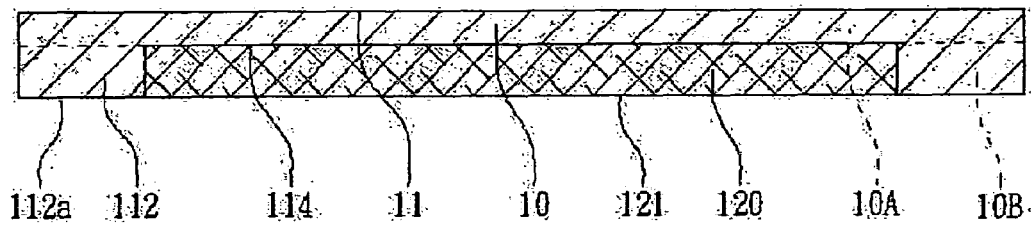

Next, referring to FIG. 4C, the lower surface 12 of the metal plate 10 is half-etched to selectively etch and remove the lower part 10B of the metal plate 10. That is, the remaining region on the lower surface 12 not covered up by the covering portion 21 is selectively etched and removed to form the protruded outer terminals 112 and an recession 114. The protruded outer terminals 112 are positioned on the lower part 10B of the metal plate 10. Next, referring to FIG. 4D, the first dry film 20 is removed for exposing the lower surface 112a of the outer terminals 112. Referring to FIG. 4E, the non-conductive ink layer 120 is formed on the recession 114 of the metal plate 10, so that the recession 114 is filled with the non-conductive ink layer 120. That is, the non-conductive ink layer 120 fills the lower part 10B of the metal plate 10. Next, referring to FIG. 4F, a grinding step is performed to grind the lower surface 12 of the metal plate 10 and the non-conductive ink layer 120, so that the non-conductive ink layer 120 does not cover up the lower surface 112a of the outer terminals 112. Preferably, one grinding surface 121 of the non-conductive ink layer 120 and the lower surface 112a of the outer terminals 112 have a coplanar surface. Besides, the non-conductive ink layer 120 is below the upper surface 111a of the bump-connecting terminals 111.

Figure 4G:
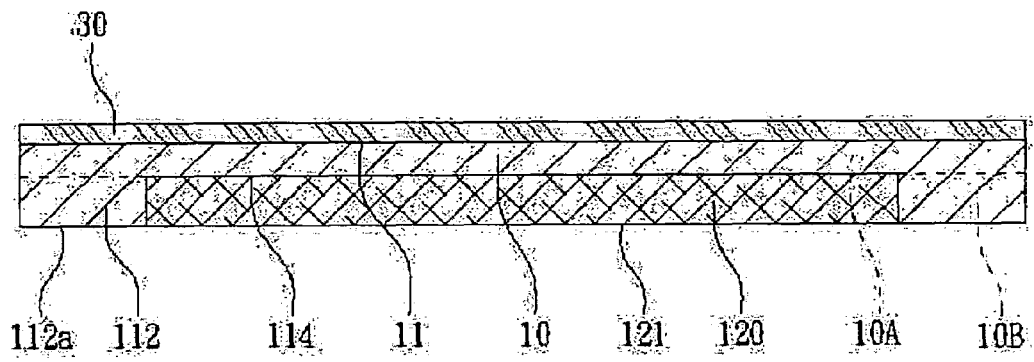
Figure 4H:
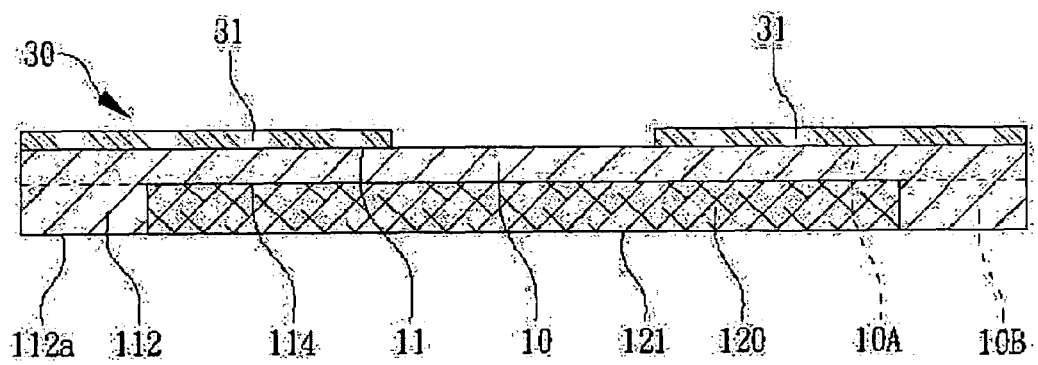
Figure 4I:
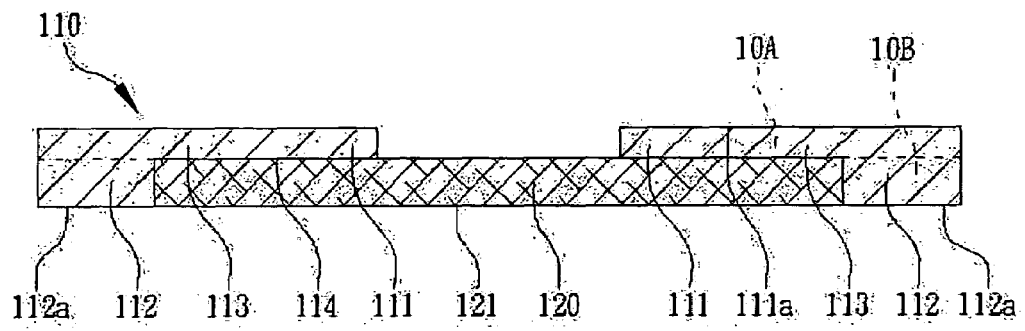
Figure 4J:
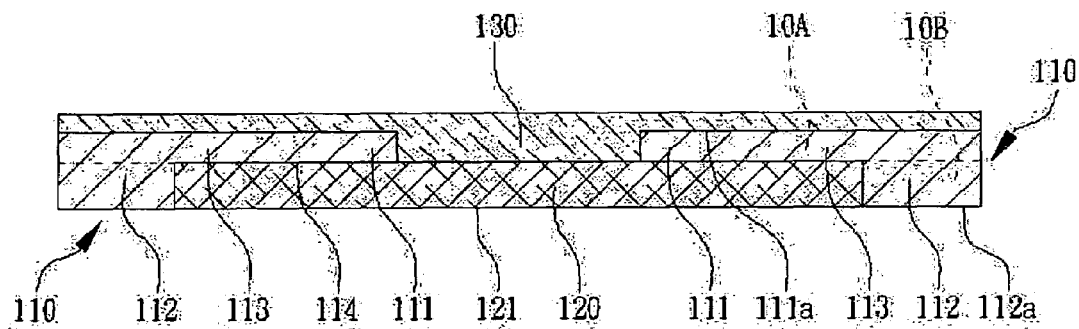
Figure 4K:
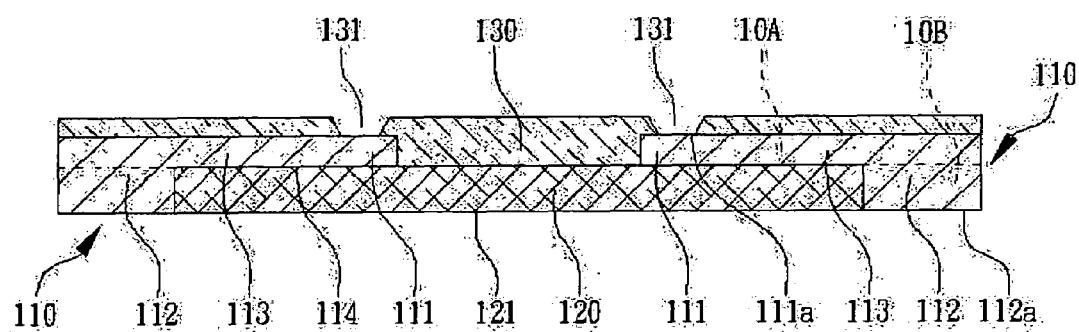

Referring to FIG. 4G, a second dry film 30 is adhered onto the upper surface 11 of the metal plate 10. After that, referring to FIG. 4H, the second dry film 30 is exposed and developed, so that a plurality of covering portion 31 is formed on the second dry film 30. The covering portions 31 cover up the upper surface 11 to form the position of the inner leads 110. Referring to FIG. 4I, the upper surface 11 of the metal plate 10 is patterned and etched to selectively etch and remove the upper part 10A of the metal plate 10, so that the redistributed lead portions 113 with the bump-connecting terminals 111, the outer terminals 112 and the inner leads 110 are formed. Moreover, the non-conductive ink layer 120 fills the clearances between the inner leads 110 for fixing the inner leads 110 with redistribution design. The covering portion 31 of the second dry film 30 is removed after the bump-connecting terminals 111. The outer terminals 112 and the inner leads 110 of the redistributed lead portions 113 are formed. Referring to FIG. 4J, a solder mask layer 130 is formed on the upper part 10A of the metal plate 10 to cover up the non-conductive ink layer 120. The solder mask layer 130, which covers up the upper surface of the inner leads 110, can be formed through printing. Since the non-conductive ink layer 120 has filled the clearances between the inner leads 110, the solder mask layer 130 is formed on the non-conductive ink layer 120 positioned between the inner leads 120 and will not spread over to the lower surface 112a of the outer terminals 112. Referring to FIG. 4K, a plurality of openings 131 are formed on the solder mask layer 130 to expose the upper surface 111a of the bump-connecting terminals 111. Lastly, a nickel-gold plating layer 140 can be electroplated on the exposed upper surface 111a of the bump-connecting terminals 111 to form the leadframe of the leadless flip-chip package 100 as shown in FIG. 1. Therefore, the invention provides a leadframe of a leadless flip-chip package 100, so that the leadframe manufacturing process of the leadframe 100 can be separated from the subsequent flip-chip package manufacturing process. Furthermore, the design of the redistributed lead portions 113 can be changed in the manufacturing process to fit the chip flip-chip bonding on various bump positions. Obviously, the application and practicability of the low cost leadframe are largely increased to replace the expensive conventional flip-chip package substrate.

Referring to FIG. 5, a flip-chip package using the above leadframe of a leadless flip-chip package 100 at least includes a leadframe 100 made from the above metal plate 10, a flip-chip chip 210 and a molding compound 220. The recession 114 formed on the lower surface of the inner leads of 110 of the leadframe 100 is filled with the non-conductive ink layer 120. The solder mask layer 130 is formed on the upper surface of the inner leads 110. The chip 210 has a plurality of bumps 211 formed on the active surface. After flip-chip bonding, the bumps 211 of the chip 210 are connected to the bump-connecting terminals 111. Being restrained by the opening 131 of the solder mask layer 130, the bumps 211 will not be spread over to other upper surfaces of the inner leads 110. The molding compound 220, which can be a molding compound or an underfilling material, is mainly used to fill up the clearance between the chip 210 and the leadframe 100 to completely seal the chip 210 or expose the rear surface of the chip 210. With the non-conductive ink layer 120, the molding compound 220 will not contaminate the lower surface 112a of the outer terminals 112. In the manufacturing process of the flip-chip package carried by the leadless leadframe, no external tape is needed to be adhered onto the lower surface of the leadframe.

SECOND EMBODIMENT

Figure 6:
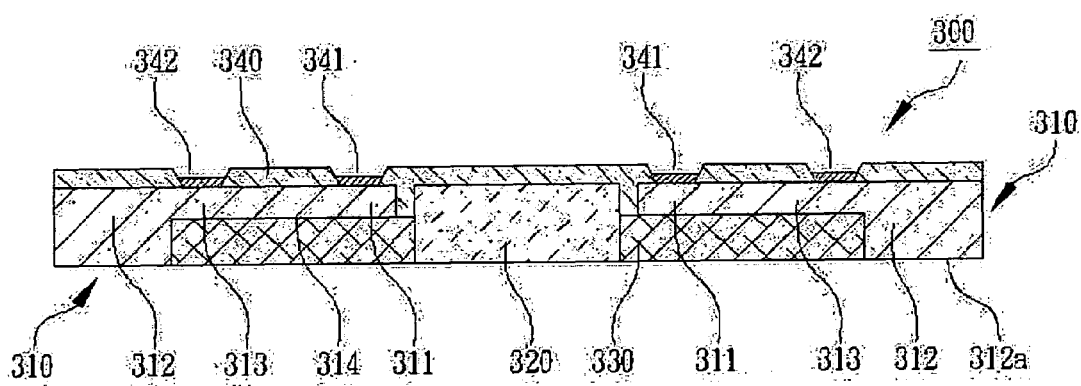
FIG. 6 is a cross-sectional view of a leadframe of a leadless flip-chip package according to a second embodiment of the invention.
Figure 7:
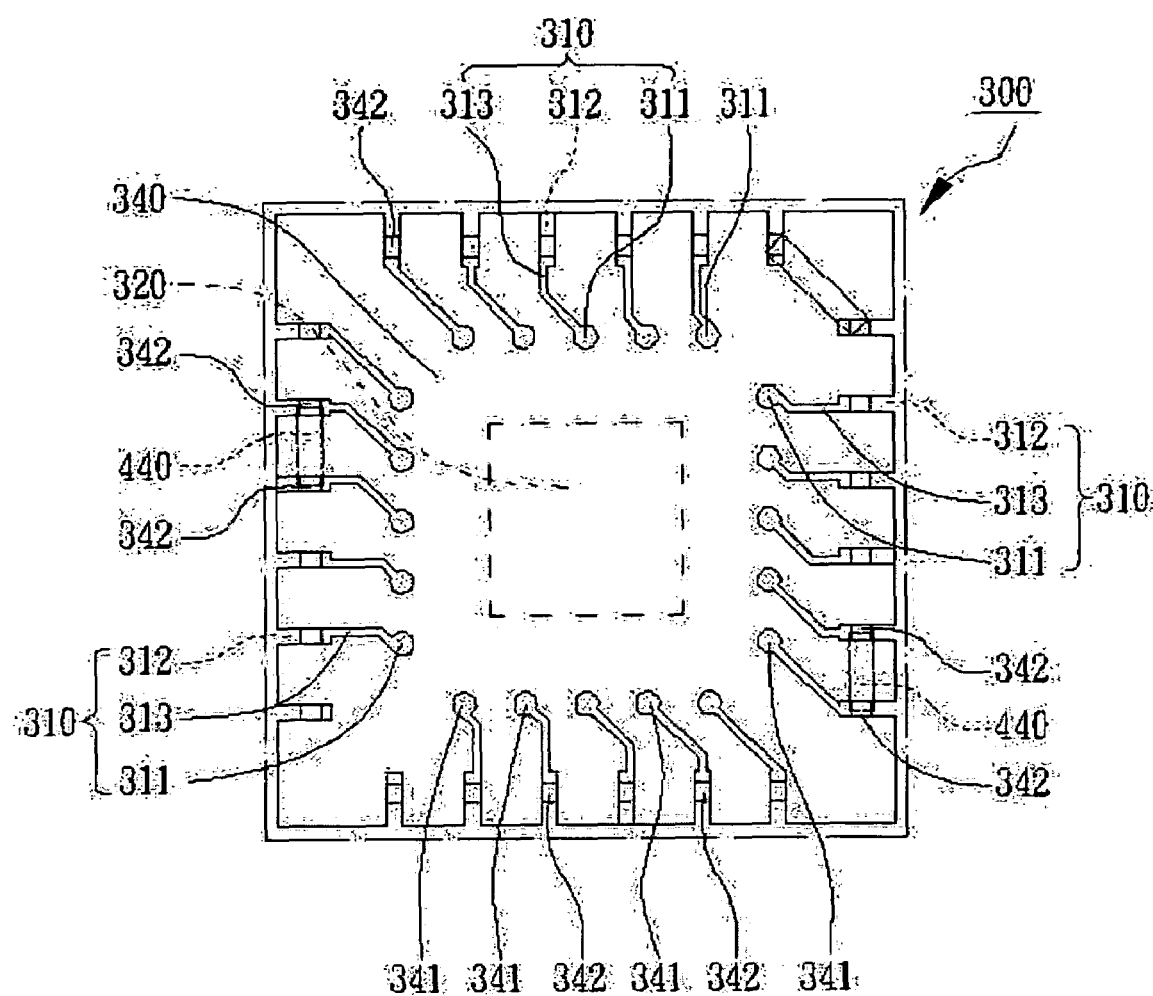
FIG. 7 is a diagram of the upper surface of the leadframe of the leadless flip-chip package according to the second embodiment of the invention.
Figure 8:
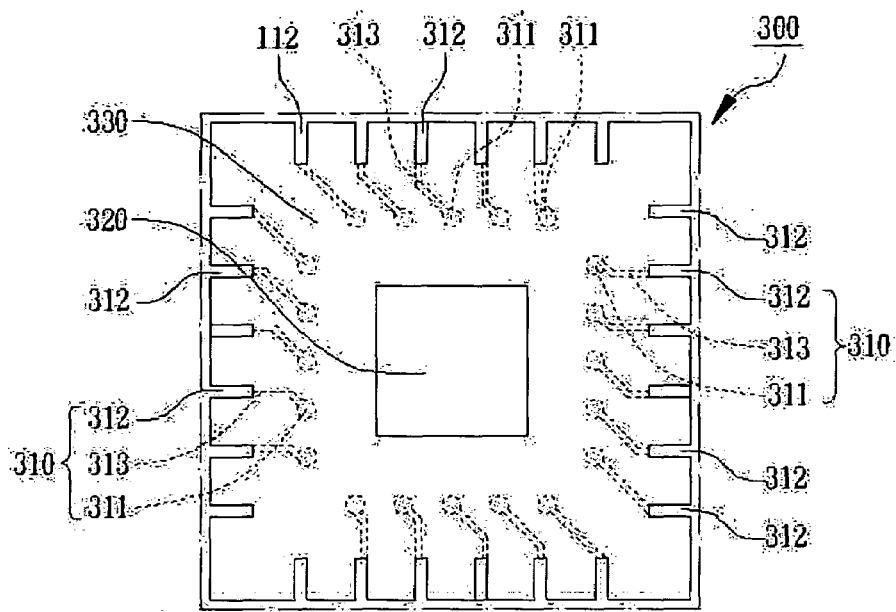
FIG. 8 is a diagram of the lower surface of the leadframe of the leadless flip-chip package according to the second embodiment of the invention.

Referring to FIGS. 6, 7 and 8, another leadframe of a leadless flip-chip package 300 made according to above manufacturing process includes a plurality of inner leads 310 and a dissipating plate 320. The dissipating plate 320 can be made of the same material with the leadframe 300. The dissipating plate 320 is positioned within the flip-chip bonding region of the leadframe as shown in FIG. 6. The leadframe 300 further includes a non-conductive ink layer 330 and a solder mask layer 340. The non-conductive ink layer 120 and the solder mask layer 130 are insulation layers. At least an inner lead 310 has a bump-connecting terminal 311, an outer terminal 312 and a redistributed lead portion 313. The redistributed lead portion 313 correspondingly connects the bump-connecting terminal 311 to the outer terminal 312. The redistributed lead portion 312 and the lower surface of the bump-connecting terminal 311 have a half-etched recession 314. The non-conductive ink layer 330 fills the recession 314. That is, the non-conductive ink layer 330 fills the clearances between the inner leads 310 for fixing the redistributed lead portions 312 of the inner leads 310, the bump-connecting terminals 311 and the dissipating plate 320. Furthermore, the non-conductive ink 330 does not cover up a lower surface 312a of the outer terminals 312, so that the outer terminals 312 are bonded with the external surface. The solder mask layer 340 is formed on the inner leads 310, the dissipating plate 320 and the non-conductive ink 330. According to the present embodiment, the solder mask layer 340 has a plurality of first openings 341 and a plurality of second openings 342. The first openings 341 are for exposing the upper surface of the bump-connecting terminals 311 for the bonding of the flip-chip bumps. The second openings 342 are for exposing partial upper surface of the redistributed lead portions 313 or for exposing the upper surface of the outer terminals 312 to be electrically connected to another chip or passive component 440. As shown in FIG. 7, a passive component 440 can be bonded onto the second openings 342. Preferably, the passive component 440 can be a capacitance. Therefore, the leadframe of the leadless flip-chip package 300 can be used to manufacture a multi-chip stacked flip-chip package with complete electrical function.

Figure 9:
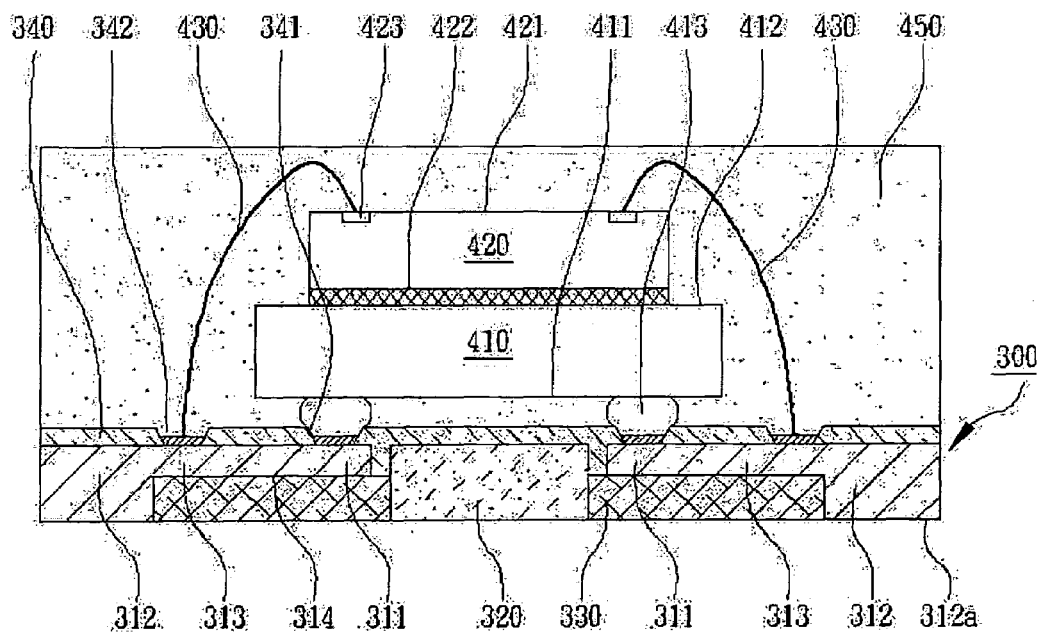
FIG. 9 is a cross-sectional view of a leadless flip-chip package using the leadframe according to the second embodiment of the invention.

Referring to FIG. 9, a flip-chip package mainly includes an above leadframe of a leadless flip-chip package 300, a first chip 410, and a second chip 420. The first chip 410 has an active surface 411 and a rear surface 412. A plurality of bumps 413 are disposed on an active surface 411 of the first chip 410. The first chip 410 is disposed on the leadframe 300 via flip-chip bonding, so that the bumps 413 are connected to the bump-connecting terminals 311 via the first openings 341 of the solder mask layer 340. The second chip 420 is stacked on the first chip 410 back to back. A rear surface 422 of the second chip 420 is disposed on the rear surface of 412 of the first chip 410. A plurality of soldering pads 423 are formed on the active surface 421 of the second chip 420. One end of a plurality of bonding wires 430 is connected to the soldering pads 423 of the second chip 420, and another end of a plurality of bonding wires 430 is connected to the inner leads 310 via the second opening 342 of the solder mask layer 340 for the second chip 420 to be electrically connected to the leadframe 300. If necessary, the surface of a passive component 440 as shown in FIG. 7 can be bonded onto the second opening 342 to connect the inner leads 310, and then a molding compound 450 is used to seal the first chip 410 and the second chip 420. Therefore, the flip-chip package can stack multi-chips on the leadless leadframe 300 to provide a practical leadframe of a leadless flip-chip package 300 with the function of redistributing the leads and improving the formation of the solder mask layer.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of a leadframe of a leadless flip-chip package, comprising:

providing a metal plate having an upper surface and a lower surface;

half-etching the lower surface of the metal plate, so as to form a recession;

forming a first insulation layer in the recession of the metal plate;

patterning and etching the upper surface of the metal plate, so as to form a plurality of inner leads, each inner lead having a bump-connecting terminal, an outer terminal and a redistributed lead portion connecting the bump-connecting terminal to the outer terminal;

forming a second insulation layer on the upper surface of the metal plate and a portion of the first insulation layer, wherein the second insulation layer has a plurality of openings for exposing an upper surface of the bump-connecting terminals.

2. The manufacturing method according to claim 1 further comprising:

grinding the lower surface of the metal plate and the first insulation layer, so that the first insulation layer does not cover the lower surface of the outer terminals.

3. The manufacturing method according to claim 2, wherein the outer terminals and the first insulation layer are grinded to have a coplanar surface.

4. The manufacturing method according to claim 1, wherein the bump-connecting terminals are arranged in grid arrays.

5. The manufacturing method according to claim 1, further comprising forming a plating layer on the upper surface of the bump-connecting terminals.

6. The manufacturing method according to claim 1, wherein the second insulation layer further comprises a plurality of openings for exposing an upper surface of the outer terminals.

7. The manufacturing method according to claim 1, wherein the second insulation layer further comprises another opening for exposing part of an upper surface of the redistributed lead portion.

8. The manufacturing method according to claim 1, wherein the first insulation layer is a non-conductive ink layer and the second insulation is a solder mask.

* * * * *